(12) United States Patent
Nebat et al.

(10) Patent No.: US 8,671,334 B2
(45) Date of Patent: Mar. 11, 2014

(54) DATA FRAGMENTATION IDENTIFICATION IN A DATA TABLE

(75) Inventors: Yoav Nebat, San Diego, CA (US); Sina Zehedi, San Diego, CA (US)

(73) Assignee: Wi-Lan, Inc., Ottawa (CA)

( * ) Notice: Subject to any disclaimer, the term of this patent is extended or adjusted under 35 U.S.C. 154(b) by 1055 days.

(21) Appl. No.: 12/202,184

(22) Filed: Aug. 29, 2008

(65) Prior Publication Data

US 2009/0150753 A1 Jun. 11, 2009

Related U.S. Application Data

(60) Provisional application No. 61/007,360, filed on Dec. 11, 2007, provisional application No. 61/019,572, filed on Jan. 7, 2008, provisional application No. 61/024,507, filed on Jan. 29, 2008, provisional application No. 61/060,117, filed on Jun. 9, 2008.

(51) Int. Cl.
*G06F 11/00* (2006.01)

(52) U.S. Cl.
USPC .......................................................... 714/784

(58) Field of Classification Search
USPC .......................................................... 714/784
See application file for complete search history.

(56) References Cited

U.S. PATENT DOCUMENTS

| | | |
|---|---|---|
| 5,546,409 A | 8/1996 | Karasawa |
| 5,826,018 A | 10/1998 | Vixie et al. |
| 5,983,383 A | 11/1999 | Wolf |
| 6,021,433 A | 2/2000 | Payne et al. |
| 6,085,253 A | 7/2000 | Blackwell et al. |
| 6,928,521 B1 * | 8/2005 | Burton et al. ................. 711/144 |
| 7,031,249 B2 | 4/2006 | Kowalski |
| 7,058,027 B1 | 6/2006 | Alessi et al. |
| 7,343,540 B2 | 3/2008 | Khermosh et al. |
| 7,464,319 B2 | 12/2008 | Budge et al. |

(Continued)

FOREIGN PATENT DOCUMENTS

| | | |
|---|---|---|
| EP | 1 718 096 | 11/2006 |
| KR | 10-1995-0010768 | 9/1995 |

(Continued)

OTHER PUBLICATIONS

Form PCT/ISA/220 Notification of Transmittal of the International Search Report and the Written Opinion of the International Searching Report, or the Declaration, mailed May 26, 2009 for corresponding PCT Application PCT/US2008/085982.

(Continued)

*Primary Examiner* — Yair Leibovich
(74) *Attorney, Agent, or Firm* — Volpe and Koenig, P.C.

(57) ABSTRACT

The subject matter disclosed herein provides a mechanism for identifying packet boundaries in a data table, such as a Reed-Solomon table. The method may include receiving one or more packets for insertion into a table. A first indicator may be inserted into the table. The first indicator may be associated with one or more rows of the table and may identify whether each of the one or more rows includes one or more fragments (e.g., a packet beginning, a packet ending, and the like). In each of the rows identified by the first indicator as including one or more fragments, a second indicator may be inserted. The second indicator may represent a length in bytes of at least one of the corresponding packet fragments. Related systems, apparatus, methods, and/or articles are also described.

18 Claims, 8 Drawing Sheets

(56) References Cited

U.S. PATENT DOCUMENTS

| | | | |
|---|---|---|---|
| 7,644,343 B2* | 1/2010 | Gubbi et al. | 714/776 |
| 7,660,245 B1 | 2/2010 | Luby | |
| 7,856,026 B1* | 12/2010 | Finan et al. | 370/412 |
| 7,877,663 B2 | 1/2011 | Vesma et al. | |
| 8,095,856 B2* | 1/2012 | Wang | 714/784 |
| 2002/0147954 A1 | 10/2002 | Shea | |
| 2003/0081564 A1* | 5/2003 | Chan | 370/328 |
| 2003/0207696 A1 | 11/2003 | Willenegger et al. | |
| 2003/0226092 A1 | 12/2003 | Kim et al. | |
| 2004/0090932 A1 | 5/2004 | Wei et al. | |
| 2004/0100937 A1 | 5/2004 | Chen | |
| 2004/0199847 A1 | 10/2004 | Calabro et al. | |
| 2004/0199850 A1 | 10/2004 | Yi et al. | |
| 2004/0237024 A1* | 11/2004 | Limberg | 714/784 |
| 2004/0243913 A1 | 12/2004 | Budge et al. | |
| 2005/0005189 A1 | 1/2005 | Khermosh et al. | |
| 2005/0088986 A1 | 4/2005 | Sun et al. | |
| 2005/0135308 A1 | 6/2005 | Vijayan et al. | |
| 2005/0265168 A1* | 12/2005 | Kopf | 369/47.12 |
| 2006/0013168 A1 | 1/2006 | Agrawal et al. | |
| 2006/0077890 A1 | 4/2006 | Suryavanshi et al. | |
| 2006/0239264 A1 | 10/2006 | Kang et al. | |
| 2006/0239265 A1 | 10/2006 | Son et al. | |
| 2006/0248430 A1 | 11/2006 | Iancu et al. | |
| 2006/0268726 A1* | 11/2006 | Alamaunu et al. | 370/242 |
| 2007/0004437 A1 | 1/2007 | Harada et al. | |
| 2007/0019717 A1 | 1/2007 | Laroia et al. | |
| 2007/0101228 A1 | 5/2007 | Vesma et al. | |
| 2007/0165578 A1 | 7/2007 | Yee et al. | |
| 2007/0186143 A1* | 8/2007 | Gubbi et al. | 714/776 |
| 2007/0230351 A1 | 10/2007 | Dang | |
| 2007/0240027 A1 | 10/2007 | Vesma et al. | |
| 2007/0253367 A1 | 11/2007 | Dang et al. | |
| 2007/0268933 A1 | 11/2007 | Wu et al. | |
| 2008/0022345 A1 | 1/2008 | Kim et al. | |
| 2008/0052605 A1 | 2/2008 | Luo et al. | |
| 2008/0056219 A1 | 3/2008 | Venkatachalam | |
| 2008/0062872 A1* | 3/2008 | Christiaens et al. | 370/231 |
| 2008/0080474 A1 | 4/2008 | Kitchin | |
| 2008/0098283 A1 | 4/2008 | Vayanos et al. | |
| 2008/0114711 A1 | 5/2008 | Nagaraj | |
| 2008/0225819 A1 | 9/2008 | Niu et al. | |
| 2008/0282310 A1* | 11/2008 | Koppelaar et al. | 725/118 |
| 2009/0034459 A1 | 2/2009 | Shousterman et al. | |
| 2009/0055715 A1* | 2/2009 | Jashek et al. | 714/776 |
| 2009/0109890 A1 | 4/2009 | Chow et al. | |
| 2009/0150736 A1 | 6/2009 | Nebat et al. | |
| 2009/0177940 A1 | 7/2009 | Guo et al. | |
| 2009/0259920 A1 | 10/2009 | Guo et al. | |
| 2010/0115379 A1* | 5/2010 | Gubbi et al. | 714/776 |
| 2010/0138727 A1* | 6/2010 | Song et al. | 714/784 |
| 2010/0183077 A1 | 7/2010 | Lee et al. | |
| 2010/0211850 A1* | 8/2010 | Song et al. | 714/758 |
| 2011/0235724 A1* | 9/2011 | Kim et al. | 375/240.27 |
| 2012/0079356 A1* | 3/2012 | Choi et al. | 714/784 |

FOREIGN PATENT DOCUMENTS

| | | |
|---|---|---|
| KR | 10-0371157 | 3/2003 |
| KR | 10-2005-0114162 | 12/2005 |
| KR | 10-2006-011864 | 10/2006 |
| KR | 10-2006-0064677 | 6/2007 |
| KR | 10-2006-00064677 | 6/2007 |
| KR | 10-2007-0068456 | 6/2007 |
| WO | 2005/022814 | 3/2005 |

OTHER PUBLICATIONS

IEEE 802.16 Broadband Wireless Access Working Group, IEEE 802.16lpc-00/33, "FEC Performance of Concatenated Reed Solomon and Convolution Coding with Interleaving," (Jun. 8, 2000).

Jenkac et al., "Flexible outer Reed-Solomon coding on RLC layer for MBMS over GERAN," Vehicular Technology Conference. vol. 5, pp. 2777-2781 (May 2004).

Agashe et al., "CDMA2000 High Rate Broadcast Packet Data Air Interface Design," IEEE Comm. Magazine, pp. 83-89 (Feb. 2004).

Form PCT/ISA/220, Notification of Transmittal of the International Search Report and the Written Opinion of the International Searching Authority, or the Declaration, mailed May 18, 2009.

Form PCT/ISA/220, Notification of Transmittal of the International Search Report and the Written Opinion of the International Searching Authority, or the Declaration, mailed Apr. 30, 2009.

Form PCT/ISA/220, Notification of Transmittal of the International Search Report and the Written Opinion of the International Searching Authority, or the Declaration, mailed Apr. 20, 2009.

Form PCT/ISA/220, Notification of Transmittal of the International Search Report and the Written Opinion of the International Searching Authority, or the Declaration, mailed May 26, 2009.

Form PCT/ISA/220, Notification of Transmittal of the International Search Report and the Written Opinion of the International Searching Authority, or the Declaration, mailed Jun. 24, 2009 for corresponding PCT Application PCT/US2008/086103.

Form PCT/ISA/220, Notification of Transmittal of the International Search Report and the Written Opinion of the International Searching Authority, or the Declaration, mailed May 26, 2009 for corresponding PCT Application PCT/US2008/086278.

IEEE 802.16 Broadband Wireless Access Working Group, IEEE 802.16lpc-00/33, "FEC Performance of Concatenated Reed Solomon and Convolutional Coding with Interleaving," (Jun. 8, 2000).

IEEE 802.16 Broadband Wireless Access Working Group, IEEE 802.16lmaint-08/293, "Optional outer-coded data mode for MBS," (Sep. 11, 2008).

Jenkac et al., "Flexible outer Reed-Solomon coding on RLC layer for MBMS over GERAN," Vehicular Technology Conference, vol. 5, pp. 2777-2781 (May 2004).

Patent Cooperation Treaty (PCT) International Search Report, PCT/US2008/085984, Notification of Transmittal of the International Search Report and the Written Opinion of the International Searching Authority, or the Declaration, mail date Mar. 27, 2009, 11 pages.

Pursley et al., "Variable-Rate Coding for Meteor-Burst Communications," IEEE Trans. On Comm., vol. 37, No. 11 (Nov. 1989).

QUALCOMM, "MBMS design consideration," 3GPP TSG WGIT, R1-02-1099 (Jan. 7-10, 2003).

Wang et al., "System Architecture and Cross-Layer Optimization of Video Broadcast over WiMAX," IEEE Journal on Selected Areas in Communications, vol. 25, No. 4 pp. 712-721 (May 2007).

Wei et al., "Application of NB/WB AMR Speech Codes in the 30-kHz TDMA System," IEEE Trans. On Comm., vol. 6, No. 6 (Nov. 2004).

* cited by examiner

DATA FRAGMENTATION IDENTIFICATION IN A DATA TABLE

CROSS REFERENCE TO RELATED APPLICATION

This application claims the benefit under 35 U.S.C. §119(e) of the following provisional applications, all of which are incorporated herein by reference in their entirety: U.S. Ser. No. 61/007,360, entitled "Multimedia Broadcast System," filed Dec. 11, 2007; U.S. Ser. No. 61/019,572, entitled "Multimedia Broadcast System," filed Jan. 7, 2008; U.S. Ser. No. 61/024,507, entitled "Multimedia Broadcast System," filed Jan. 29, 2008; and U.S. Ser. No. 61/060,117, entitled "Multimedia Broadcast System," filed Jun. 9, 2008.

FIELD

The subject matter described herein relates to wireless communications.

BACKGROUND

Channel coding, such as forward error-correction coding or error-correction coding, introduces redundancy into a signal prior to transmission or storage of the signal. The redundancy enables a receiving system to detect and, perhaps, correct errors introduced into the signal by, for example, the channel, receiver, transmitter, storage medium, and the like. For example, in a communication system that employs forward error-correction coding, a source provides data to an encoder (also referred to as a coder). The encoder inserts redundant (also sometimes referred to as parity) bits, thereby outputting a longer sequence of code bits, called a codeword. The codewords can then be transmitted to a receiver, which uses a suitable decoder to extract the original, unencoded data and correct errors caused by, for example, the channel and/or the receiver.

Channel coding can thus be used to detect and/or correct errors—reducing the need for the source transmitter to retransmit data received in error. By reducing the need to retransmit data that is in error, the throughput of the channel or link is improved. Moreover, the correction of errors also improves the quality of the data received at the receiver. In the case of a digital video broadcast, error-correction coding enhances not only the quality of the digital video broadcast over the wireless channel but also improves the throughput of the wireless channel.

SUMMARY

The subject matter disclosed herein provides a mechanism for identifying fragments.

In one aspect there is provided a method. The method may include receiving one or more packets for insertion into a table; inserting into the table a first indicator identifying the location of a fragment included in the table; and inserting into the table a second indicator to identify the length of the fragment.

In another aspect there is provided a method. The method may include receiving one or more packets for insertion into a table. A first indicator may be inserted into the table. The first indicator may be associated with one or more rows of the table and may identify whether each of the one or more rows includes one or more fragments. In each of the rows identified by the first indicator as including one or more fragments, a second indicator may be inserted. The second indicator may represent a length in bytes of at least one of the fragments.

In another aspect, there is provided a method. The method may include receiving one or more packets for insertion into a table. The table may be divided into a plurality of sub-tables, each of the sub-tables including a set of one or more rows. The first indicator may be inserted into each of the sub-tables. For each of the sub-tables, one or more second indicators may be inserted in at least one of the rows, when the first indicator identifies the at least one row as including one or more fragments.

In another aspect, there is provided a method. The method may include inserting into a table one or more packets received at a client station. A packet may be read from the table based on a first indicator and a second indicator. The first and second indicators identify at least one of a start and an end of the packet. The read packet may then be provided.

In another aspect, there is provided a system. The system may include means for receiving one or more packets for insertion into a table. The system may also include means for inserting into the table a first indicator associated with one or more rows of the table, the first indicator identifying whether each of the one or more rows includes one or more fragments; and means for inserting, in each of the rows identified by the first indicator as including one or more fragments, a second indicator, the second indicator representative of a length in bytes of at least one of the fragments.

In another aspect, there is provided a system. The system may include means for inserting into a table one or more packets received at a client station. The system may also include means for reading a packet from the table based on a first indicator and a second indicator, the first and second indicators identifying at least one of a start and an end of the packet. Moreover, the system may include means for providing the read packet.

In another aspect, there is provided a computer-readable medium containing instructions to configure a processor to perform a method for receiving one or more packets for insertion into a table; inserting, into the table, a first indicator identifying a location of a fragment included in the table; and inserting, into the table, a second indicator to identify the length of the fragment.

In yet another aspect, there is provided a computer-readable medium containing instructions to configure a processor to perform a method for receiving one or more packets for insertion into a table; inserting, into the table, a first indicator associated with one or more rows of the table, the first indicator identifying whether each of the one or more rows includes one or more fragments; and inserting, in each of the rows identified by the first indicator as including one or more fragments, a second indicator, the second indicator representative of a length in bytes of at least one of the fragments.

In another aspect, there is provided a computer-readable medium containing instructions to configure a processor to perform a method for receiving one or more packets for insertion into a table; dividing the table into a plurality of sub-tables, each of the sub-tables including a set of one or more rows; inserting the first indicator into each of the sub-tables; and for each of the sub-tables, inserting one or more second indicators in at least one of the rows, when the first indicator identifies the at least one row as including one or more fragments.

In yet another aspect, there is provided a computer-readable medium containing instructions to configure a processor to perform a method for receiving one or more packets for insertion into a table; dividing the table into blocks including a set of rows and a set of columns; inserting the first indicator into each of the blocks; and for each of the blocks, inserting one or more second indicators, when the first indicator identifies one or more fragments.

In still yet another aspect, there is provided a computer-readable medium containing instructions to configure a processor to perform a method for inserting, into a table, one or more packets received at a client station; reading at least one of the packets from the table based on a first indicator and a second indicator, the first and second indicators identifying at least one of a start and an end of the at least one packet; and providing the at least one read packet.

In another aspect there is provided a system. The system includes a processor and a memory, wherein the processor and the memory are configured to perform a method including receiving one or more packets for insertion into a table; inserting, into the table, a first indicator identifying a location of a fragment included in the table; and inserting, into the table, a second indicator to identify a length of the fragment.

In another aspect there is provided a system. The system includes a framer configured to receive one or more packets for insertion into a table, to insert into the table a first indicator associated with one or more rows of the table, the first indicator identifying whether each of the one or more rows includes one or more fragments, and to insert, in each of the rows identified by the first indicator as including one or more fragments, a second indicator, the second indicator representative of a length in bytes of at least one of the fragments.

In another aspect there is provided a system. The system includes a processor and a memory, wherein the processor and the memory are configured to perform a method including receiving one or more packets for insertion into a table; dividing the table into a plurality of sub-tables, each of the sub-tables including a set of one or more rows; inserting the first indicator into each of the sub-tables; and for each of the sub-tables, inserting one or more second indicators in at least one of the rows, when the first indicator identifies the at least one row as including one or more fragments.

In another aspect there is provided a system. The system includes a processor and a memory, wherein the processor and the memory are configured to perform a method including receiving one or more packets for insertion into a table; dividing the table into blocks including a set of rows and a set of columns; inserting the first indicator into each of the blocks; and for each of the blocks, inserting one or more second indicators, when the first indicator identifies one or more fragments.

In another aspect there is provided a system. The system includes a deframer configured to insert into a table one or more packets received at a client station, to read at least one of the packets from the table based on a first indicator and a second indicator, the first and second indicators identifying at least one of a start and an end of the at least one packet, and to provide the at least one read packet.

Variations of the above aspects may include one or more of the following features. The received packets may be inserted into a Reed-Solomon table configured to enable a Reed-Solomon forward-error correction coder to encode at least a portion of the Reed-Solomon table. A bit-map indicator may be used as the first indicator. A fragment may be identified as being at least one of a beginning of a packet or an end of a packet. The bit-map indicator may include a plurality of bits, each of the plurality of bits corresponding to one of the rows and identifying whether one or more fragments are included in the corresponding row. The first indicator may include 8-bits, wherein a first bit of the 8-bits corresponds to a first row, and a second bit of the 8-bits corresponds to a second row, the first bit indicating whether one or more fragments are included in the first row, and the second bit indicating whether one or more fragments are included in the second row. A fragment size indicator may be used as the second indicator. The fragment size indicator may include a value representative of the length in bytes of a fragment. The table may be encoded using a forward-error correction code before transmission to a client station. The rows may be arranged as horizontal portions of the table. The rows may be arranged as vertical portions of the table. A forward-error correction coder may be coupled to the framer. The forward-error correction coder may be configured to encode, before transmission to a client station, the received packets, the first indicator, and the second indicator. A forward-error correction decoder may be coupled to the deframer. The forward-error correction decoder may be configured to decode the one or more packets, the first indicator, and the second indicator.

The details of one or more variations of the subject matter described herein are set forth in the accompanying drawings and the description below. Features and advantages of the subject matter described herein will be apparent from the description and drawings, and from the claims.

Figure 1:
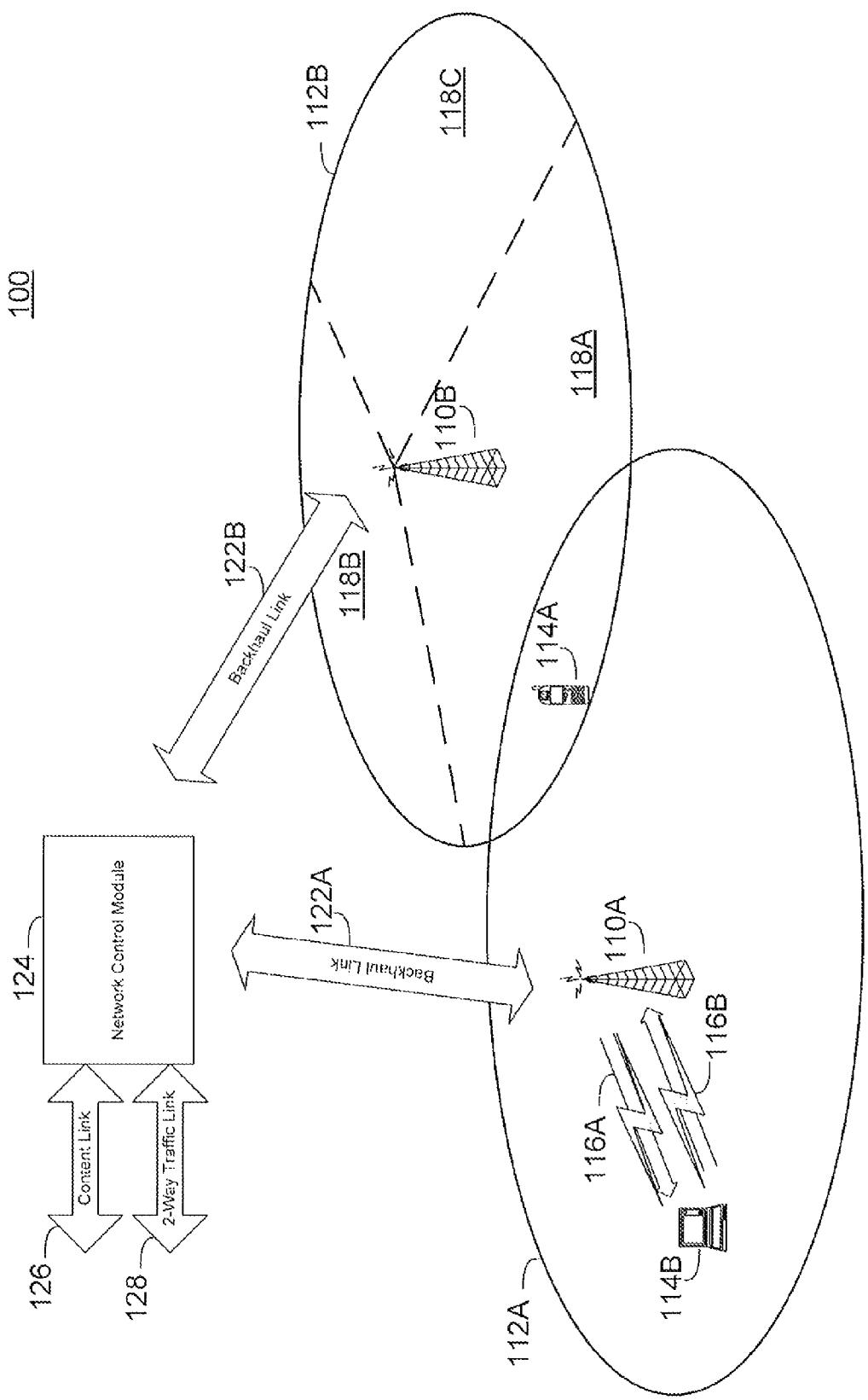
FIG. 1 depicts a block diagram of a network including client stations and base stations.

Like labels are used to refer to same or similar items in the drawings.

DETAILED DESCRIPTION

FIG. 1 is a simplified functional block diagram of an embodiment of a wireless communication system 100. The wireless communication system 100 includes a plurality of base stations 110A and 110B, each supporting a corresponding service or coverage area 112A and 112B. The base stations are capable of communicating with wireless devices within their coverage areas. For example, the first base station 110A is capable of wirelessly communicating with a first client station 114A and a second client station 114B within the coverage area 112A. The first client station 114A is also within the coverage area 112B and is capable of communicating with the second base station 110B. In this description, the communication path from the base station to the client station is referred to as a downlink 116A and the communication path from the client station to the base station is referred to as an uplink 116B.

Although for simplicity only two base stations are shown in FIG. 1, a typical wireless communication system 100 includes a much larger number of base stations. The base stations 110A and 110B can be configured as cellular base station transceiver subsystems, gateways, access points, radio frequency (RF) repeaters, frame repeaters, nodes, or any wireless network entry point.

The base stations 110A and 110B can be configured to support an omni-directional coverage area or a sectored coverage area. For example, the second base station 110B is depicted as supporting the sectored coverage area 112B. The coverage area 112B is depicted as having three sectors, 118A, 118B, and 118C. In typical embodiments, the second base station 110B treats each sector 118 as effectively a distinct coverage area.

Although only two client stations 114A and 114B are shown in the wireless communication system 100, typical systems are configured to support a large number of client stations. The client stations 114A and 114B can be mobile, nomadic, or stationary units. The client stations 114A and 114B are often referred to as, for example, mobile stations, mobile units, subscriber stations, wireless terminals, or the like. A client station can be, for example, a wireless handheld device, a vehicle mounted device, a portable device, client premise equipment, a fixed location device, a wireless plug-in accessory, or the like. In some cases, a client station can take the form of a handheld computer, notebook computer, wireless telephone, personal digital assistant, wireless email device, personal media player, meter-reading equipment, or the like and may include a display mechanism, microphone, speaker, and memory.

In a typical system, the base stations 110A and 110B also communicate with each other and a network control module 124 over backhaul links 122A and 122B. The backhaul links 122A and 122B may include wired and wireless communication links. The network control module 124 provides network administration and coordination as well as other overhead, coupling, and supervisory functions for the wireless, communication system 100.

In some embodiments, the wireless communication system 100 can be configured to support both bidirectional communication and unidirectional communication. In a bidirectional network, the client station is capable of both receiving information from and providing information to the wireless communications network. Applications operating over the bidirectional communications channel include traditional voice and data applications. In a unidirectional network, the client station is capable of receiving information from the wireless communications network but may have limited or no ability to provide information to the network. Applications operating over the unidirectional communications channel include broadcast and multicast applications. In some embodiments, the wireless system 100 supports both bidirectional and unidirectional communications. In those embodiments, the network control module 124 is also coupled to external entities via, for example, content link 126 (e.g., a source of digital video and/or multimedia) and two-way traffic link 128.

The wireless communication system 100 can be configured to use Orthogonal Frequency Division Multiple Access (OFDMA) communication techniques. For example, the wireless communication system 100 can be configured to substantially comply with a standard system specification, such as IEEE 802.16 and its progeny or some other wireless standard such as, for example, WiBro, WiFi, Long Term Evolution (LTE), or it may be a proprietary system. The subject matter described herein is not limited to application to OFDMA systems or to the noted standards and specifications. The description in the context of an OFDMA system is offered for the purposes of providing a particular example only. Further, the subject matter described herein is not limited to applications in multi-cast and/or broadcast systems, but may be implemented in any communications system.

In some embodiments, downlink 116A and uplink 116B each represent a radio frequency (RF) signal. The RF signal may include data, such as voice, video, images, Internet Protocol (IP) packets, control information, and any other type of information. When IEEE-802.16 is used, the RF signal may use OFDMA. OFDMA is a multi-user version of orthogonal frequency division multiplexing (OFDM). In OFDMA, multiple access is achieved by assigning to individual users groups of subcarriers (also referred to as tones). The subcarriers are modulated using BPSK (binary phase shift keying), QPSK (quadrature phase shift keying), QAM (quadrature amplitude modulation), and carry OFDMA symbols (also referred to as symbols) including data coded using a forward-error correction code.

Figure 2:
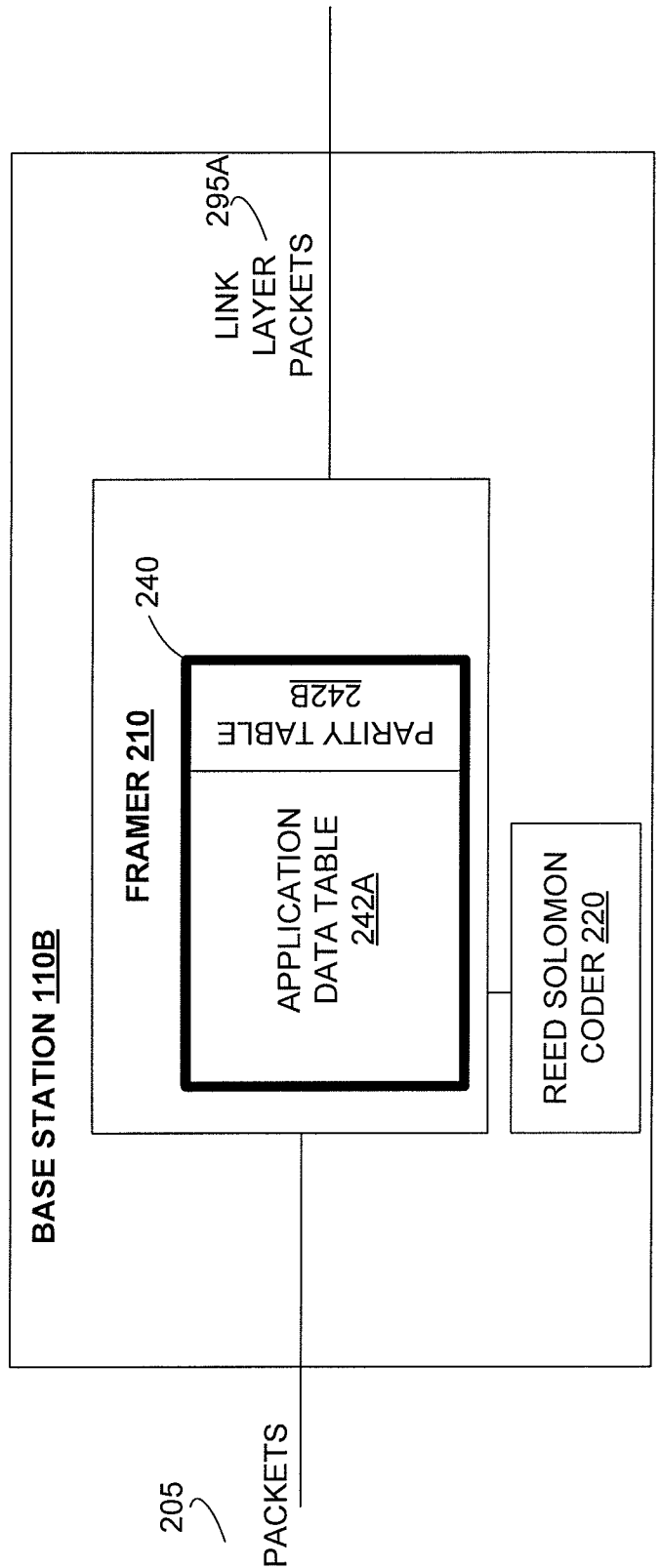
FIG. 2 depicts a block diagram of a base station configured to use a bit-map indicator (BMI) and a fragment size indicator (FSI) to delineate packet boundaries.

FIG. 2 depicts an implementation of base station 110B. Base station 110B includes a framer 210 for arranging data into a table, such as a Reed-Solomon table 240, to enable interleaving and forward-error correction coding of the data. The Reed-Solomon table 240 further includes an application data table 242A and a parity table 242B. For example, framer 210 inserts received packets 205 into the Reed-Solomon table 240 (and, in particular, application data table 242A) to enable Reed-Solomon coder 220 to read and then encode the packets in that table. For example, each of the rows (or columns) of the Reed-Solomon table 240 can be read and then encoded to form Reed-Solomon codewords. Once determined, the Reed-Solomon codewords (including parity bits) can be inserted back into Reed-Solomon table 240 (including parity table 242B). The Reed-Solomon code used for encoding is systematic, meaning that the determined codeword comprises the original data followed by computed parity bits. Thus, in such embodiments, when inserting the computed codewords back into Reed-Solomon table 240, only the parity table 242B portion of Reed-Solomon table 240 may change. It should be noted that although the present embodiments are discussed with reference to Reed-Solomon error correction codes, it should be understood that in other embodiments other types of block codes may be used, such as, for example, low density parity check (LDPC) codes, BCH codes, etc.

After encoding, framer 210 may read one or more values of the rows (or columns) of Reed-Solomon table 240 and insert the read values into link-layer packets 295A. In some cases, the link-layer packets 295A are implemented as protocol data units (PDUs), which may include a header at the front of each PDU and a CRC (cyclic redundancy check) appended at the end of each PDU. Although the examples described herein describe a Reed-Solomon table and associated forward-error correction, other types of tables and error correction may be used as well. Moreover, the values of table 240 may be the actual data values or references to locations in memory where the data resides. Furthermore, as used herein the term "table" refers a data structure, such as a frame, which can include data or references to data contained in another mechanism.

The subject matter described herein relates to identifying the locations of fragments in a table, such as Reed-Solomon table 240. The term "fragment" refers to a packet or a portion of a packet that only occupies part of a row, when the packets 205 are written into Reed-Solomon table 240 row-by-row (e.g., a packet that does not completely fill a row of a table, such as Reed-Solomon table 240). For example, as packets 205 are written to Reed-Solomon table 240, a complete packet, including the header and error correction and detection portions of the packet, are written to, for example, a row of Reed-Solomon table 240. Because the packet may not have the exact same width as a row of Reed-Solomon table 240, the packet may not occupy the entire row of table 240, but instead partially occupy the row. As additional packets 205 are written into table 240, some rows in table 240 may include the end of one packet and the start of another packet—causing fragments in Reed-Solomon table 240. Although the above example describes writing packets into Reed-Solomon table 240 row-by-row, packets 205 may be written into Reed-Solomon table 240 in other ways (e.g., column-by-column, block-by-block, and the like). When the packets 205 are written into Reed-Solomon table 240 column-by-column or block-by-block, the fragment refers to a packet or portion of a packet that does not completely fill the column or the block. Moreover, although the above describes writing the packets 205 into table 240, the packet 205 may be written to application data table 242A rather than parity table 242B.

In some embodiments, a bit-map indicator is used to identify the location of fragments and a fragment size indicator is used to indicate the length of a fragment identified by the bit-map indicator. Moreover, in some implementations, because the bit-map indicator and fragment size indicator are included in Reed-Solomon table 240, the forward-error correction provided by Reed-Solomon coder 220 protects the bit-map indicator and fragment size indicator from errors caused by transmission, thus providing a robust method of delivering the boundaries of packets (also referred to as packet delimiter information).

Figure 3:
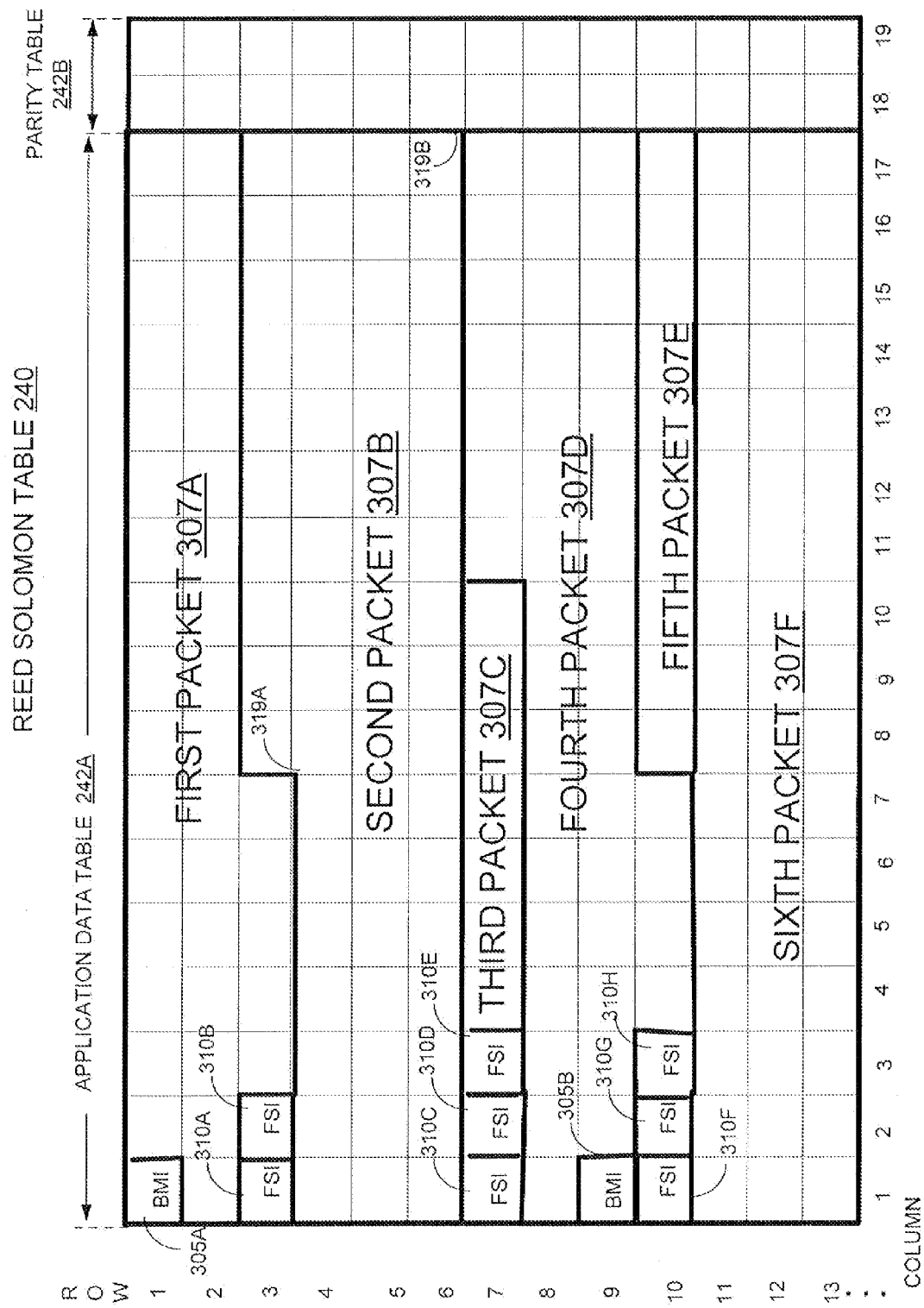
FIG. 3 depicts an example of a Reed-Solomon table including bit-map indicators and fragment size indicators.

FIG. 3 depicts the Reed-Solomon table 240 of FIG. 2 further including packets 307A-F, bit-map identifiers 305A-B, and fragment size indicators 310A-H. The description of FIG. 3 will also make reference to FIG. 2, as well. The received packets 205 are written to Reed-Solomon table 240 (and, in particular the application data table 242A) as a first packet 307A, a second packet 307B, a third packet 307C, a fourth packet 307D, a fifth packet 307E, and a sixth packet 307F. A bit-map identifier (BMI) identifies the location of a fragment and a fragment size indicator (FSI) indicates the length of the fragment identified by the bit-map indicator. For example, the bit-map identifier identifies which rows in a set of rows (also referred to as a sub-table) include a fragment. Moreover, the fragment size indicator (FSI) indicates, for each of the fragments in a row identified as having a fragment, a fragment length. In some implementations, the bit-map indicator and fragment size indicator provide a compact way to describe packet delimiter information (e.g., starting and ending locations of packets) for table 240—resulting in a reduction in the amount of information transmitted from, for example, a base station to a client station to identify the locations of packets within a frame. Moreover, in some implementations, using a predetermined location in the frame for the BMI prevents error propagation. Furthermore, in some implementations, the BMI and FSI corresponding to a packet are located in the same codeword as the packet fragment. As such, if the BMI and FSI are in error, the packet is in error as well, and no additional information is lost. In addition, in some implementations, a reduction in overhead may result from locating, in the same codeword, the BMI, FSI, and the corresponding packet, as noted above, since the requirement for more robust error protection for the fragment identification mechanism, to insure losses in this information do not dominate system performance, may also be alleviated using the FSI and BMI described herein.

The bit-map indicator (BMI) 305A is associated with a sub-table of rows 1-8 of table 240, such that bit-map indicator 305A indicates whether any of rows 1-8 includes a fragment. In the example of FIG. 3, bit-map indicator 305A may be implemented as an 8-bit byte, and each bit of that 8-bit byte indicates if a corresponding row includes a fragment. Specifically, bit-map indicator 305A may have a value 0010 0010 to indicate that rows 3 and 7 have fragments. In some implementations, bit-map indicators may be inserted periodically in table 240 to indicate which row in a sub-table of rows has a fragment. For example, bit-map indicator 305B may be associated with the sub-table of rows 9-16, another bit-map indicator would be associated with the sub-table of rows 17-24, and so forth throughout Reed-Solomon table 240.

Once a bit-map indicator indicates that a row has a fragment, the row identified as having a fragment also includes a fragment size indicator to indicate the size of the fragment. For example, row 3 has fragment size indicators (labeled FSI 310A and FSI 310B) to describe the length of each of the fragments associated with the first packet 307A and the second packet 307B. The fragment size indicator 310A may be implemented as an 8-bit byte, the value of which indicates the length in bytes (or columns of the table) of the fragment. In the case of fragment size indicator 310A and row 3, fragment size indicator 310A may have a binary value of 0000 0101, i.e., 5, to describe the length of the fragment of first packet 307A, which ends at 319A. The fragment size indicator 310B may have a binary value of 0000 1010, i.e., 10, to describe the length of the fragment of second packet 307B, which starts at 319A. Referring to row 7 of FIG. 3, fragment size indicator 310C may have the value of 0000 0000 to indicate that the previous packet 307B ended at 319B, which is the last column of row 6 (e.g., the remaining portion of packet 307B completely filled row 6, and that the length of the fragment of packet 307B in row 7 is 0). In the case of fragment size indicator 310D, it may have a binary value of 0000 0111, i.e., 7, to identify the length of the fragment associated with third packet 307C, while fragment size indicator 310E may have a value of 0000 0111, i.e., 7, to identify the length of the fragment associated with the fourth packet 307D.

In some implementations, when the values of the fragment size indicators are summed in any given row, the fragment size indicator values typically add up to the quantity of symbols (or columns) in the given row less the number of fragment size indicator bytes (and, if present, the bit-map indicator(s)). For example, in row 7, fragment size indicators 310C, 310D, and 310E sum to the value 14 (i.e., 0+7+7), and when the three fragment size indicator bytes are added, the total is 17, which represents the number of bytes (or columns) of the application data table 242A portion of Reed-Solomon table 240. This additive property may be used to check for errors in a row as well as determine packet boundaries even when there are errors in a given row. For example, when there are no errors in the codeword, the number of FSIs can be inferred by performing the addition. In other words, the receiver will keep treating the next byte as an FSI until the sum adds-up to the data length. If the computed bytes however do not add-up to the data length, the receiver may identify that a possible error condition exists.

Although the description provided above uses a bit-map indicator implemented as an 8-bit byte representative of which rows of Reed-Solomon table 240 have a fragment, the bit-map indicator may be implemented in other ways as well. For example, the bit-map indicator may have other bit lengths and be associated with other quantities of rows (e.g., a 16 bit bit-map indicator indicating which rows in a sub-table of 16 rows has a fragment, or a 16 bit bit-map indicator indicating which rows in a sub-table of 10 rows has a fragment). Moreover, although the description above uses the bit-map indicator to indicate which row of Reed-Solomon table 240 has a fragment, the bit-map indicator may be used in a column-based approach and a block-based approaches as well (e.g., to indicate which column or block of a table has a fragment). Furthermore, although the above description inserts the bit-map indicator as the first symbol of a row and as the first row of the sub-table, the bit-map indicator may be included in other predetermined locations (and multiple locations) in a row and in other predetermined locations in the sub-table (e.g., the bit-map indicator may appear as the second symbol of a row and may appear in the second row of each sub-table, such as rows 2 and 10). Moreover, although in FIGS. 3 and 7 (as described below) the rows are depicted as horizontal portions of the Reed-Solomon table and the columns are depicted as vertical portions of the Reed-Solomon table, in some embodiments, the rows are arranged as a vertical portion of the Reed-Solomon table and, as such, the columns would be arranged as a horizontal portion of the Reed-Solomon table.

In some implementations, when the first fragment size indicator of a row has a predetermined value (e.g., a value of 0000 0000, or 0x00, the predetermined value may indicate that the first byte after the last fragment size indicator in the row is the first byte of a packet. For example, fragment size indicator 310C may have the value 0x00 to indicate that the first byte after fragment size indicator 310E is the first byte of third packet 307C. Moreover, the last fragment size indicator of a row can also use a predetermined value (e.g., 0x00) to indicate that the last byte in the row is the last byte of a packet. For example, fragment size indicator 310H may have a value of 0x00 to indicate that the last byte of row 10 is the last byte of fifth packet 307E. Furthermore, predetermined values may also be used to indicate a fill packet. For example, if a fragment size indicator has a value of 0xFF (where 0x specifies that the following value, "FF," is in hexadecimal format, i.e., all bits of the first fragment size indicator byte are set to "1"), that value represents that the fragment is a fill packet. A fill packet refers to padding in table 240 to fill the table when there is an insufficient amount of packets to fill table 240. In the example of the 0xFF byte, the byte immediately following a 0xFF byte may be interpreted as the size of the fill packet fragment. Although fill packets are encoded (and thus protected) by the Reed-Solomon encoding provided by Reed-Solomon coder 220, and are transmitted over the air to a client station, the client station typically discards fill packets. A fill packet can span more than one row (or column) of table 240 and is typically used as the last packet in Reed-Solomon table 240.

Figure 4:
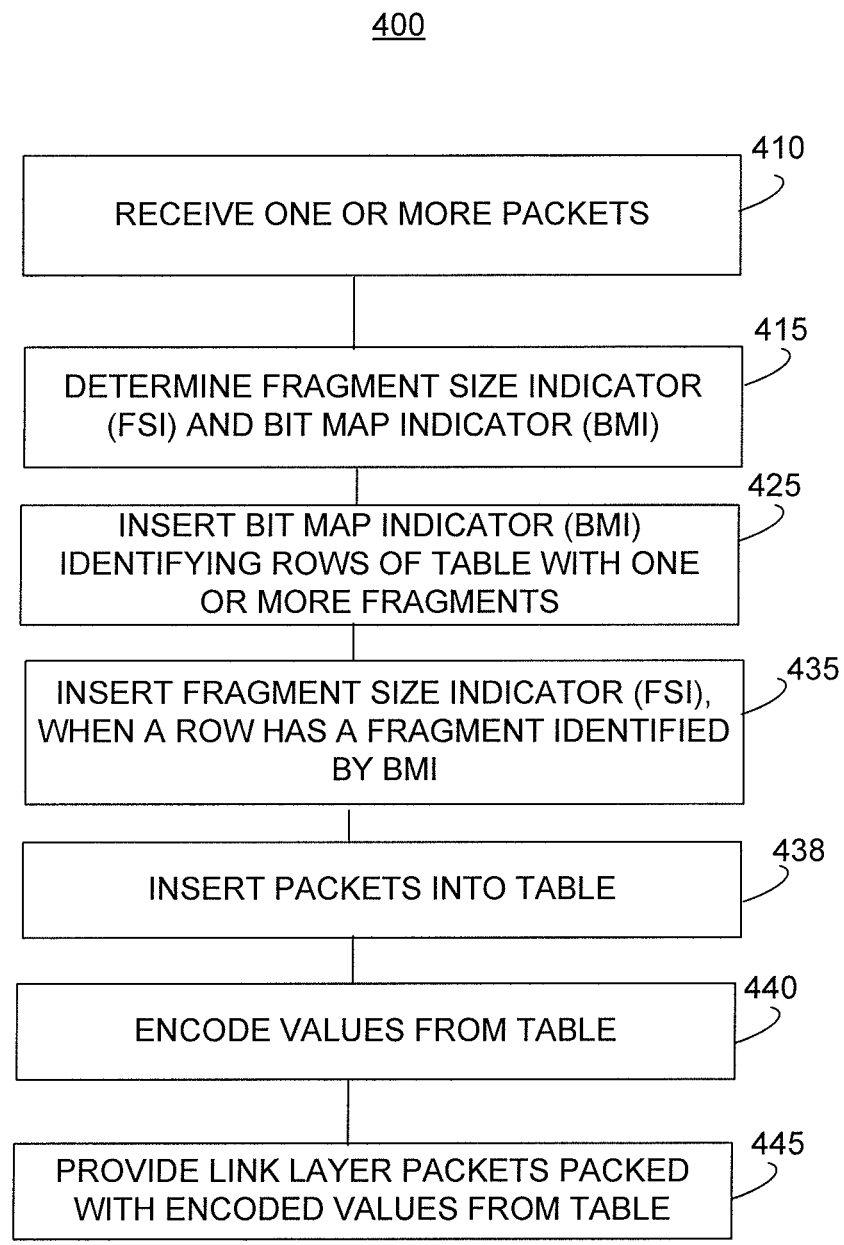
FIG. 4 depicts a process at a base station for using a bit-map indicator (BMI) and a fragment size indicator (FSI)

FIG. 4 depicts a process 400 for identifying fragments in a table, such as Reed-Solomon table 240. Reference will be made to FIGS. 2-4 during the description of process 400.

At 410, framer 210 receives one or more packets 205. For example, the packets 205 may be application data packets associated with multimedia content, such as digital broadcast television. Moreover, the packets may be organized into streams, providing a so-called "channel" of content (e.g., a stream corresponding to local news, a stream for 24-hour national news, a stream for movies, and so forth).

At 415, framer 210 determines the locations and values for the FSIs and BMIs to be included in a table in which the packets will be inserted. Framer 210 may determine the FSIs and BMIs by computing the values of the FSIs and BMIs given the received packets, their sizes, and the size of frame 240. For example, if a received packet has a length of 180 bytes, and the frame 240 can only accommodate 150 bytes in each row, the framer 210 will be able to determine the corresponding value of the BMI (e.g., a fragment in a second row of the sub-table) and FSI (e.g., a fragment length in the second row of 31 bytes, where the first row includes the 1 byte BMI followed by 149 bytes of the packet, and the remaining 31 byte fragment of the packet will be included in the second row).

At 425, framer 425 inserts a bit-map indicator to identify which rows have fragments. The bit-map indicators may be inserted in each of the sub-tables to identify which rows within the sub-table have a fragment. For example, Reed-Solomon table 240 may be divided into sub-tables, each of which includes 8 rows, i.e., 8 rows per sub-table, so that each of the sub-tables has a corresponding bit-map indicator to indicate which of the sub-table rows have a fragment. Moreover, the framer 210 may periodically insert the bit-map indicator in the first row of each of the sub-tables and that insertion may be at a predetermined location. Returning to the 8 rows per sub-table example, a bit-map indicator may be inserted in each of the first rows of the sub-tables, such as rows 1, 9, 17 and so forth, and each of those bit-map indicators may be inserted as the first byte (e.g., column 1) of Reed-Solomon table 240. Moreover, the bit-map indicator may be inserted multiple times per sub-table to provide robustness and may be inserted in other predetermined locations within the sub-tables (e.g., in other than the first row or first column of a sub-table).

At 435, framer 210 inserts one or more fragment size indicators in each row identified by a bit-map indicator as having a fragment. For example, framer 210 inserts fragment size indicators 310A-H to describe the length of a corresponding fragment. As described above, framer 210 inserts fragment size indicator 310D to identify the length of the fragment at row 7 associated with third packet 307C, inserts fragment size indicator 310E to identify the length of the fragment at row 7 associated with the fourth packet 307D.

At 438, framer 210 inserts packets 205 into a table, such as Reed-Solomon table 240. Referring to FIG. 3, the packets 205 may be inserted row-by-row into table 240 (i.e., inserting into portions of application data table 242A not occupied by a BMI or FSI) by inserting into application data table 242A the first packet 307A into the first row, then continuing to fill the second row, and inserting the remaining portion of packet 307A into the third row, as depicted, for example, at FIG. 3.

At 440, Reed-Solomon coder 220 reads values of data from Reed-Solomon table 240 to encode code blocks using a code, such as a Reed-Solomon forward-error correction code, although other forward-error correction codes may be used as well. In some implementations, for each row, Reed-Solomon coder 220 reads the row, encodes the row, and inserts the encoded row, which is in the form of a codeword including parity bits, into Reed-Solomon table 240 (including parity table 242B). As noted, Reed-Solomon coder 220 may also read the values from Reed-Solomon table 240 in other ways, such as using a column-by-column basis or a block-by-block basis. Framer 210 packs link-layer packets using the codewords. To pack the link-layer packets, framer 210 may read from Reed-Solomon table 240 (including parity table 242B) the one or more encoded codeword values by reading those values from columns, rows, or a combination of the two, so long as the receiver(s) know where in the table each data byte should be written. While application packets can be written row-by-row, column-by-column or block-by-block into the Reed-Solomon table 240, the codewords are typically written into the rows (i.e., row-by-row) of the table 240, and the link-layer packets are read either in columns (i.e., column-by-column) or in blocks from the table 240.

At 445, framer 210 provides the link-layer packets packed with the encoded values (e.g., codewords) from table 240. Moreover, the link-layer packets may be further encoded using an inner-code before being provided to base station 110B, or by base station 110B for transmission to a client station, such as client station 114A. Base station 110B may include a radio frequency (RF) front-end comprising an antenna to transmit an RF signal, such as a downlink to client station 114A. The RF front-end may also include other components, such as filters, analog-to-digital converters, an Inverse Fast Fourier Transform (IFFT) module, and a symbol mapper. These and other components may be used to modulate data, such as link-layer packets, onto the RF signal transmitted by base station 110B and carried by the RF signal. In some implementations, the base station 110B is compatible with IEEE 802.16 and transmits an RF signal configured as an OFDMA signal, including subcarriers carrying the link-layer packets. It should be noted that the ideas described herein are not limited to IEEE 802.16 systems or other wireless systems, but are applicable to any communication system.

Figure 5:
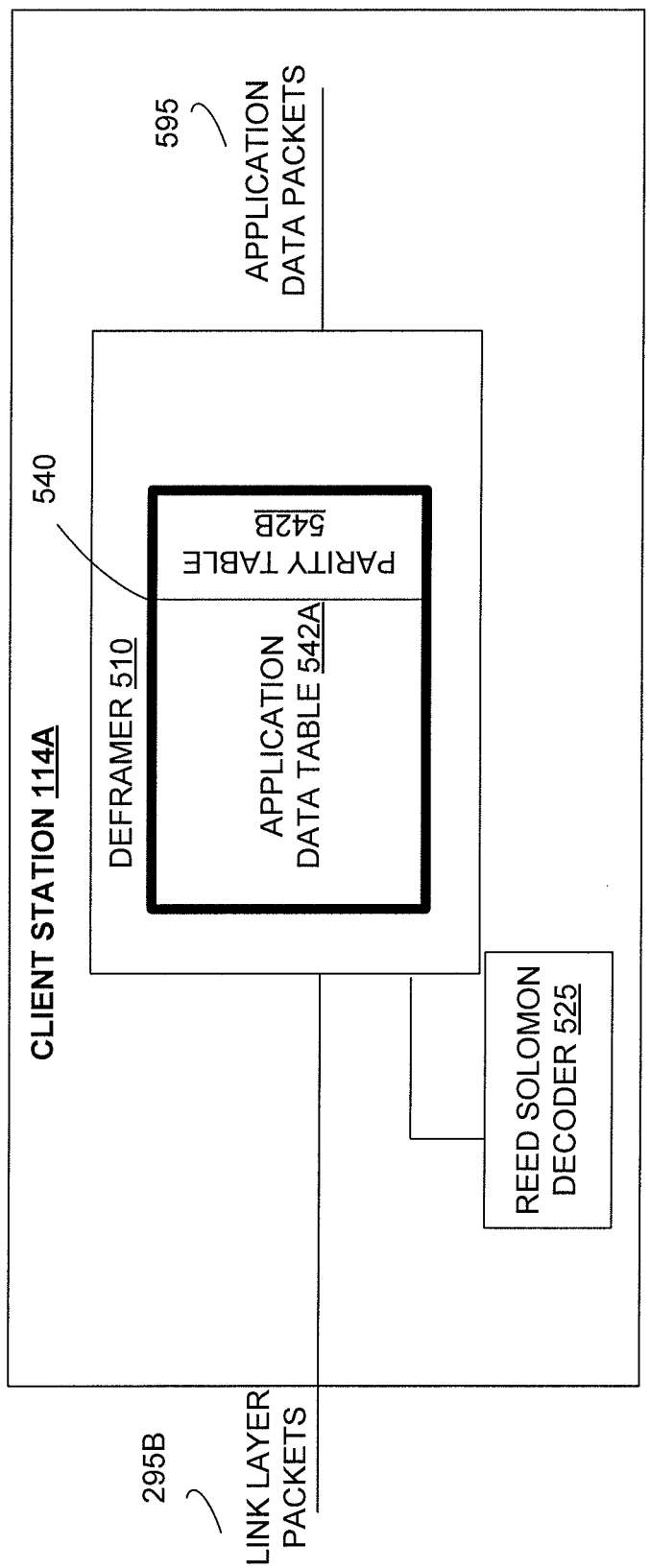
FIG. 5 depicts a block diagram of a client station configured to use a bit-map indicator (BMI) and a fragment size indicator (FSI) to delineate packet boundaries.

FIG. 5 depicts a client station 114A. Client station 114A includes a deframer 510 for arranging data, such as link-layer packets 295B received from base station 110B. For example, client station 114A may include a radio frequency (RF) front-end comprising an antenna to receive an RF signal, such as a downlink from base station 110B. The RF front-end may also include other components, such as filters, analog-to-digital converters, a Fast Fourier Transform (FFT) module, and a symbol demapper. These and other components may be used to demodulate the RF signal into data and, in particular, the link-layer packets for use at the client station. In some implementations, the client station 114A is compatible with IEEE 802.16 and receives an RF signal configured as an OFDMA signal carrying the link-layer packets.

Client station 114A also includes a table, such as a Reed-Solomon table 540. For example, received link-layer packets 295B are inserted into the Reed-Solomon table 540 in the same manner that the packets were obtained from the Reed-Solomon table at base station 110B (e.g., by rows, columns, or a combination of the two). The inserted link-layer packets are then decoded by Reed-Solomon decoder 525 using the same forward-error correction code used at Reed-Solomon coder 220. The output of Reed-Solomon decoder 525 is typically a forward error corrected version of Reed-Solomon table 540 including packets 307A-F, bit-map indicators 305A-B, and fragment size indicators 310A-H. Deframer 510 then uses bit-map indicators 305A-B and fragment size indicators 310A-H to read the packets in Reed-Solomon table 540, which are provided as application data packets 595 to, for example, an application at client station 114A.

Figure 6:
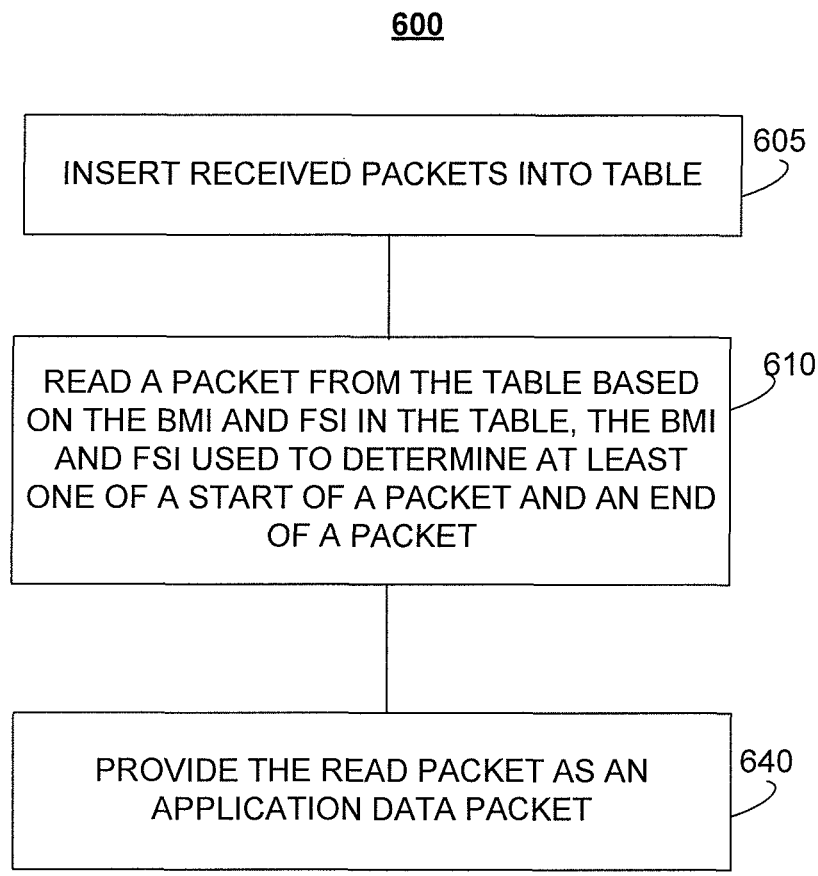
FIG. 6 depicts a process at a client station for using a bit-map indicator (BMI) and a fragment size indicator (FSI)

FIG. 6 depicts a process 600 for processing, at a client station, received packets in table 540. The process 600 will be described by referring to FIGS. 5-7.

At 605, client station 114A inserts into table 540 one or more link-layer packets 295B, which are received from a wireless network and base station 110B. Moreover, the link-layer packets may be inserted into the Reed-Solomon table 540 in the same manner that the packets were obtained from the Reed-Solomon table at base station 110B (e.g., by rows, columns, or a combination of the two). Moreover, the link-layer packets inserted into table 540 may be decoded using the same forward-error correction code used at base station 110B. For example, if Reed-Solomon coder 220 encoded each row of table 240 using a RS (255, 243) code, then Reed-Solomon decoder 525 decodes each row of table 540 using an RS (255, 243) code.

In some embodiments, the link-layer packets 295B may be defined to be in accordance with a hybrid automatic retransmission request (HARQ) PDU format. In such embodiments, the HARQ PDUs received at 605 may include a header in the front and a cyclic redundancy check (CRC) appended to the end of the data. If the link layer packets (e.g., HARQ PDUs) include a header and/or CRC, the header and/or CRC may be removed before inserting the link layer packet into table 540.

Figure 7:
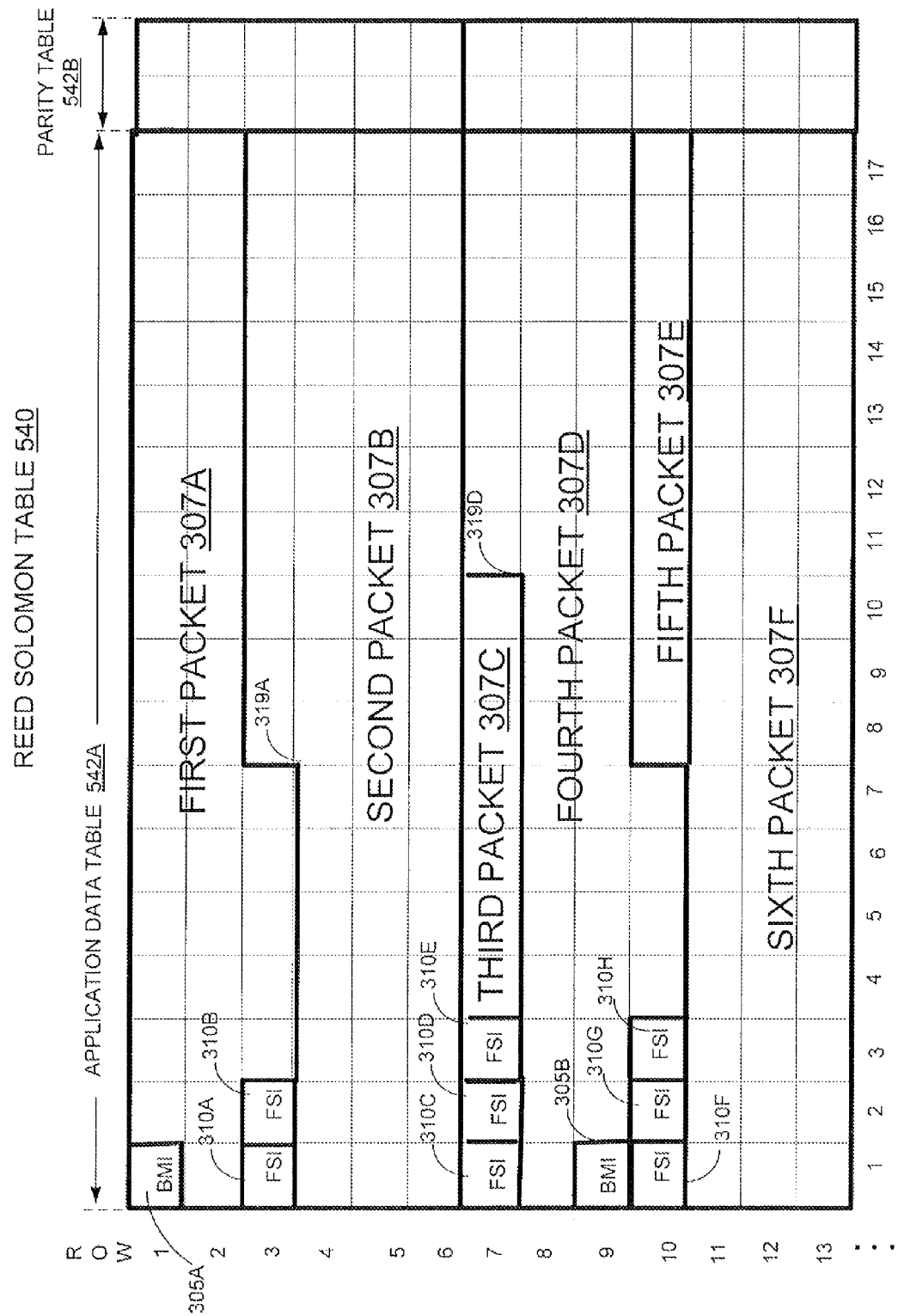
FIG. 7 depicts an example of a Reed-Solomon table including bit-map indicators and fragment size indicators after forward-error correction decoding at a client station.

FIG. 7 depicts Reed-Solomon table 540 after the received packets have been inserted into Reed-Solomon table 540 and decoded by Reed-Solomon decoder 525. FIG. 7 shows that table 540 includes the forward-error correction decoded representations of the packets 307A-F, bit-map indicators 305A-B, and fragment size indicators 310A-H, all of which were transmitted by base station 110B.

At 610, deframer 510 reads a packet from the table based on at least one bit-map indicator and at least one fragment size indicator in the table. For example, deframer 510 reads third packet 307C at Reed-Solomon table 540 based on bit-map indicator 305A, which indicates that rows 3 and 7 have fragments, and fragment size indicator 310D, which indicates the length of the fragment corresponding to the third packet 307C. As such, deframer 510 is able to identify the boundaries of packet 307C. Deframer 510 also reads packets 307A-B and 307D-F using the corresponding bit-map indicators and fragment size indicators.

At 640, deframer 510 provides the read packet as, for example, an application data packet, to another component of client station 114A. For example, deframer 510 uses bit-map indicators 305A-B and fragment size indicators 310A-H to provide each of packets 307A-F, which were read at 610, to another component, such as an application for processing and presenting digital video broadcast television.

Figure 8:
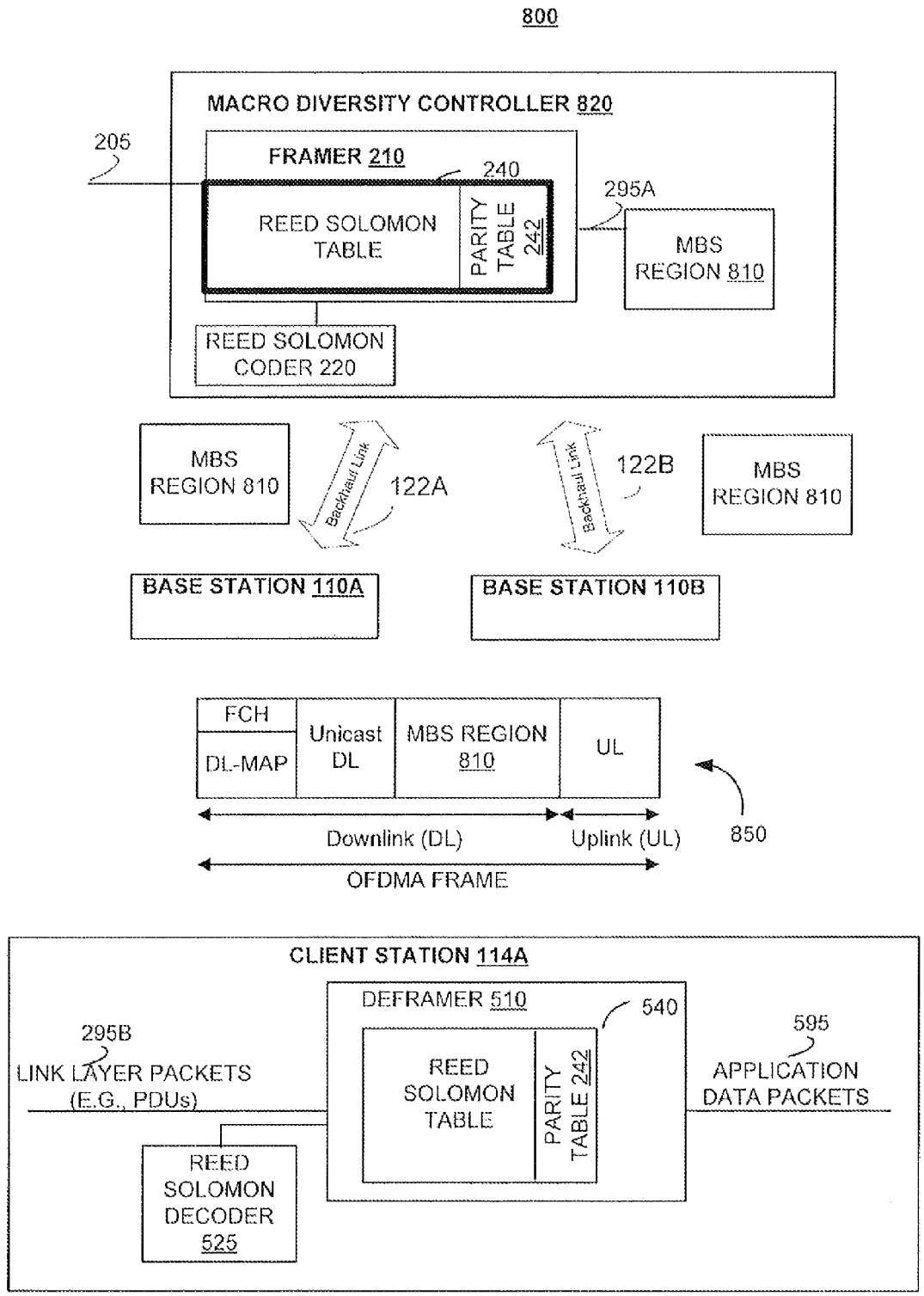
FIG. 8 depicts a system including a macrodiversity controller, base stations, and a client station.

FIG. 8 depicts an implementation of framer 210, Reed-Solomon table 240, and Reed-Solomon coder 220 in a macrodiversity controller 820. The output of framer 210, as described above at 445 of FIG. 4, may be link-layer packets 295A, such as protocol data units (PDUs) (e.g., HARQ PDUs in conformance with IEEE 802.16). The PDUs are inserted into a multicast-broadcast region 810 (MBS), such as MBS regions consistent with IEEE 802.16. The macrodiversity controller 820 distributes the MBS regions, such as MBS region 810, to zero or more base stations, such as base stations 110A and 110B. The macrodiversity controller 820 also schedules the transmissions of MBS regions, such as MBS region 810, at base stations 110A and 110B, so that the macrodiversity transmissions are synchronous with respect to the same OFDMA frame 850 being transmitted at about the same frequency using about the same waveform (e.g., same modulation and coding scheme), and using about the same framing parameters (e.g., number of symbols in the OFDMA frame, length of symbol, cyclic prefix, and the like). The base stations 110A and 110B each insert the MBS region 810 into an OFDMA frame 850. The base stations 110A and 110B then transmit the OFDMA frame 850 to client stations, such as client station 114A. The MBS region 810 (including the bit-map indicators and fragment size indicators of table 240) may be transmitted using macrodiversity, while other portions of the OFDMA frame 850 may not use macrodiversity.

At the client station, such as client station 114A, macrodiversity provides a so-called "macrodiversity gain" by combining the synchronous broadcasts of base stations 110A and 110B. For example, base station 110A and base station 110B would each transmit frame 850 including the frame control header (FCH), downlink map (DL-MAP), and unicast downlink (DL) without using macrodiversity, while base stations 110A and base station 110B transmit MBS region 810 using macrodiversity—providing at the client station 114A macrodiversity gain with respect to the received MBS region 810 (including the bit-map indicators and fragment size indicators). The process 600 described above may then be used to insert the received PDUs (or link-layer packets 295B) into Reed-Solomon table 540, read packets from the table, and provide the packets, such as application data packets 595, using the bit-map indicators and fragment size indicators.

Although the example of FIG. 8 refers to two base stations 110A and 110B, there may be additional base stations operating using macrodiversity to transmit MBS regions. In some implementations, the macrodiversity controller 820 may receive packets 205 corresponding to streams of multimedia content, such as digital broadcast television and the like, each stream associated with one or more zones (e.g., geographic regions). Moreover, although FIG. 8 depicts the macrodiversity controller 820 as separate from base stations 110A, 110B, and network controller 124, macrodiversity controller 820 may be incorporated into, and/or coupled to, at least one of a base station, a network controller, and the like.

It should be noted that although the above-described embodiments were discussed in the context of IEEE 802.16 and Reed-Solomon, this was done for exemplary purposes only and the ideas described herein are not limited to such environments.

The subject matter described herein may be embodied in systems, apparatus, methods, and/or articles to provide the desired configuration. In particular, various implementations of the subject matter described, such as the components of the client stations, base stations, macrodiversity controller, may be realized in digital electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. For example, the components of client stations, base stations, macrodiversity controller, and aspects of processes 400 and 600 may be realized in digital electronic circuitry, integrated circuitry, specially designed ASICs (application specific integrated circuits), computer hardware, firmware, software (including computer programs), and/or combinations thereof.

These computer programs (also known as programs, software, software applications, applications, components, or code) include machine instructions for a programmable processor, and may be implemented in a high-level procedural and/or object-oriented programming language, and/or in assembly/machine language. As used herein, the phrases "machine-readable medium" and "computer-readable signal" refer to any computer program product, computer-readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. For example, the implementations described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Moreover, although the above describes writing to a frame row-wise and then reading from that frame column-wise, the rows and columns of the frame can be swapped (e.g., by rotating the frame by 90 degrees), in which case the above noted processes and systems continue to be operative. Other embodiments may be within the scope of the following claims.

What is claimed is:

1. A method of operating a station comprising a processor and a memory, the method comprising:
   receiving one or more communication network packets for insertion by the processor into a table in the memory, wherein the table comprises a plurality of blocks each including a set of rows and a set of columns;
   inserting, into the table, a first indicator into each of the plurality of blocks, each first indicator identifying a location of one or more fragments included in the table, wherein a fragment is a packet or a portion of a packet occupying part of a row; and
   on a condition that a row in the table includes one or more corresponding fragments, inserting, into the row in the table, one or more second indicators, each of the one or more second indicators including a value representative of a length in bytes of the corresponding fragment.

2. The method of claim 1 further comprising:
   using, as the first indicator, a bit-map indicator including a plurality of bits, each of the plurality of bits associated with a corresponding portion of the table and each bit indicating whether the corresponding portion includes at least one fragment.

3. The method of claim 1 further comprising:
   identifying at least one fragment as at least one of a beginning of a communication network packet or an end of a communication network packet.

4. The method of claim 1 further comprising:
   using, as the first indicator, a bit-map indicator including a plurality of bits, each of the plurality of bits corresponding to a portion of a block and identifying whether the one or more fragments are included in the portion of the block.

5. A method of operating a station comprising a processor and a memory, the method comprising:
   receiving one or more communication network packets for insertion by the processor into a table in the memory, wherein the table comprises a plurality of blocks each including a set of rows and a set of columns;
   inserting, into the table, a first indicator into each of the plurality of blocks, each first indicator identifying a location of one or more fragments included in the table;
   inserting, into the table, for each of the plurality of blocks, one or more second indicators, when the first indicator identifies one or more fragments;
   wherein the table comprises a plurality of rows;
   wherein each first indicator is associated with one or more rows of the table and identifies whether each of the one or more rows includes one or more fragments; and
   wherein inserting the one or more second indicators, comprises:
     inserting, in each of the rows identified by the first indicator as including one or more fragments, a second indicator representative of a length in bytes of a corresponding fragment included in the row.

6. The method of claim 5, further comprising:
inserting the one or more communication network packets into a Reed-Solomon table; and
encoding at least a portion of the Reed-Solomon table using a Reed-Solomon code.

7. The method of claim 5 further comprising:
using, as the first indicator, a bit-map indicator including a plurality of bits, each of the plurality of bits corresponding to one of the rows and identifying whether one or more fragments are included in the corresponding row.

8. The method of claim 5 further comprising:
using 8-bits as the first indicator, a first bit of the 8-bits corresponding to a first row, and a second bit of the 8-bits corresponding to a second row, the first bit indicating whether one or more fragments are included in the first row, and the second bit Indicating whether one or more fragments are included in the second row.

9. The method of claim 5 further comprising:
arranging each of the one or more rows as a horizontal portion of the table.

10. The method of claim 5 further comprising:
arranging each of the one or more rows as a vertical portion of the table.

11. The method of claim 5, wherein the table comprises a plurality of sub-tables, each of the sub-tables including a set of one or more rows;
wherein inserting one or more first indicators comprises:
inserting a first indicator into each of the sub-tables wherein the first indicator identifies for each row of the sub-table whether the row includes one or more fragments; and
wherein inserting one or more second indicators comprises:
for each of the sub-tables, inserting one or more second indicators in at least one of the rows of the sub-table when the at least one row includes one or more fragments.

12. The method of claim 11, further comprising:
using, as the first indicator, a bit-map indicator including a plurality of bits, each of the plurality of bits corresponding to one of the rows and identifying whether one or more fragments are included in the corresponding row.

13. A method of operating a station comprising a processor and a memory, the method comprising:
inserting, by the processor, into a table in the memory, one or more received communication network packets, wherein the table comprises a plurality of blocks each including a set of rows and a set of columns;
reading from the table a first indicator from each of the plurality of blocks, wherein the first indicator identifies a location in the table in which a fragment is located, wherein a fragment is a packet or a portion of a packet occupying part of a row;
on a condition that a row in the table includes one or more corresponding fragments, reading from the row in the table one or more second indicators that identify a length in bytes of the one or more corresponding fragments;
reading at least one communication network packet from the table based on the first indicator and the one or more second indicators; and
providing the at least one read communication network packet.

14. The method of claim 13 further comprising:
decoding, using a Reed-Solomon forward-error correction code, the at least one communication network packet after inserting the at least one communication network packet into the table.

15. The method of claim 13, wherein reading the at least one communication network packet further comprises:
reading, based on the first and second indicators, a portion of the at least one communication network packet, the portion forming a fragment.

16. The method of claim 13, wherein reading the at least one communication network packet further comprises:
wherein the first indicator is a bit-map indicator including a plurality of bits, each of the plurality of bits corresponding to one of the rows of the table and identifying whether one or more fragments are included in the corresponding row; and
wherein the second indicator includes a value representative of a length of one of the fragments in the corresponding row.

17. The method of claim 13, wherein the first indicator is a bit-map indicator including a plurality of bits each of the plurality of bits associated with a corresponding portion of the table and each bit indicating whether the corresponding portion of the table includes at least one fragment.

18. A system comprising:
a station comprising a processor and a memory; and
a framer coupled to the station and operated by the processor, the framer configured to:
receive one or more communication network packets for insertion into a table in the memory, the table comprising a plurality of blocks each including a set of rows and a set of columns;
insert into the table a first indicator into each of the plurality of blocks each identifying a location of one or more communication network packet beginnings or endings in the table; and
insert into each of the plurality of blocks one or more second indicators, when the first indicator identifies one or more communication network packets, each identifying a length in bytes of a corresponding communication network packet fragment included in the table, wherein a packet fragment is a packet or a portion of a packet occupying part of a row.

* * * * *